May 12, 1953 R. B. WOODBURY 2,638,549

CIRCUIT FOR NEUTRALIZATION OF FREQUENCY DIVIDER CHAINS

Filed Dec. 28, 1945 2 Sheets-Sheet 1

INVENTOR
ROGER B. WOODBURY

BY M. O. Hayes

ATTORNEY

May 12, 1953 R. B. WOODBURY 2,638,549

CIRCUIT FOR NEUTRALIZATION OF FREQUENCY DIVIDER CHAINS

Filed Dec. 28, 1945 2 Sheets-Sheet 2

INVENTOR
ROGER B. WOODBURY

BY M O Hayes

ATTORNEY

Patented May 12, 1953

2,638,549

UNITED STATES PATENT OFFICE 2,638,549

CIRCUIT FOR NEUTRALIZATION OF FREQUENCY DIVIDER CHAINS

Roger B. Woodbury, Boston, Mass., assignor, by mesne assignments, to the United States of America as represented by the Secretary of the Navy Application December 28, 1945, Serial No. 637,745

5 Claims. (Cl. 250—36)

This invention relates to frequency dividers, and more particularly to series connected frequency dividing blocking oscillators.

Series connected blocking oscillators have been developed for frequency dividing or counting down of a series of pips. When blocking oscillators are connected in this manner interference between the oscillators may result. Means must be provided to neutralize the stages so that the firing of one blocking oscillator will not affect the blocking oscillator preceding it. Heretofore this has been accomplished by using biased-off amplifiers for coupling between blocking oscillators.

It is an object of my invention to provide means for preventing such interference between blocking oscillators, which means does not require the use of extra tubes, and which uses few components.

It is a further object of my invention, in one form which it may take, to provide a circuit utilizing the output waveform of a blocking oscillator to prevent the following blocking oscillator from affecting its operation whenever said following blocking oscillator fires.

It is a still further object of my invention, in another form which it may take, to provide an improved circuit employing a feedback to neutralize the effect on a preceding circuit when a blocking oscillator operates.

To accomplish the foregoing general objects, and more specific objects which hereinafter appear, my invention resides in the circuit elements and their relation one to another, as are more particularly described in the following specification. The specification is accompanied by drawings in which.

Figure 1:
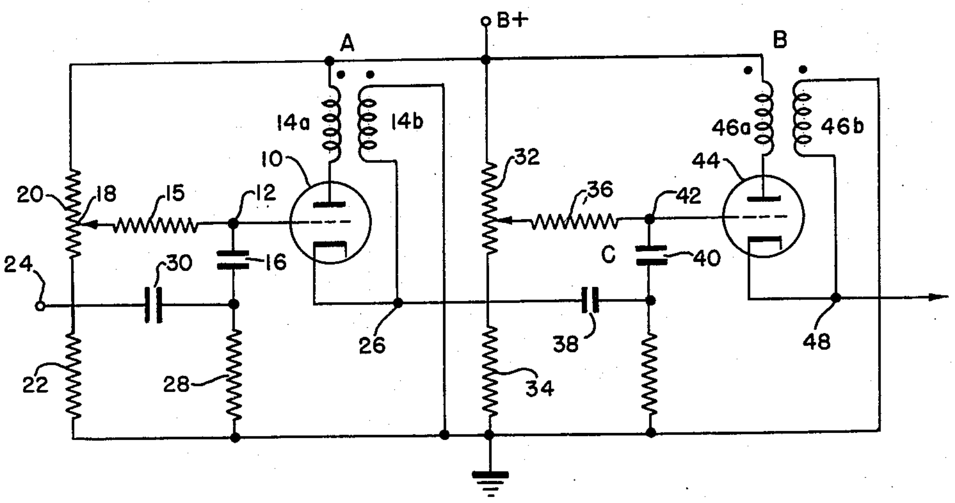
Fig. 1 is a diagram showing one method of coupling between stages.
Figure 3:
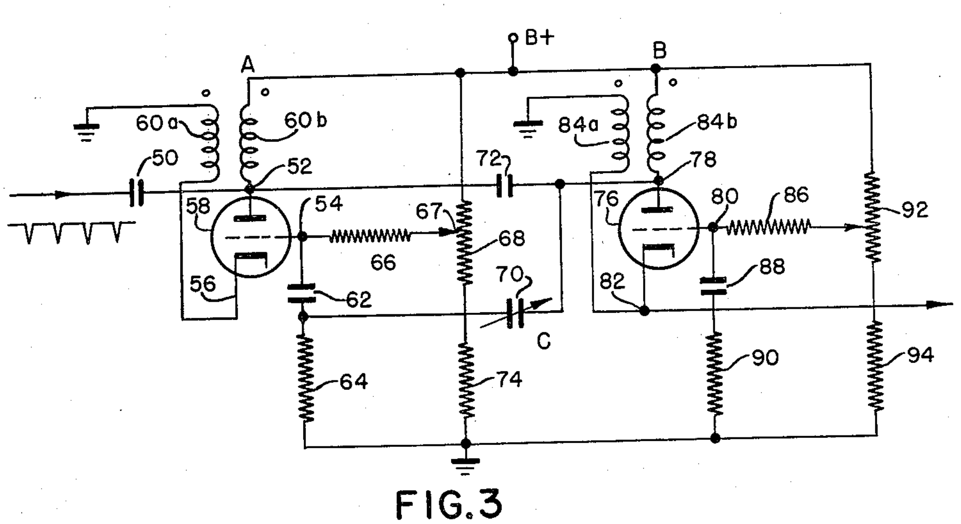
Fig. 3 is a diagram showing another form of my invention.

Referring to both forms of my invention, as shown in Figs. 1 and 3, the invention comprises a blocking oscillator stage A followed by a second blocking oscillator stage B. Each stage is used for counting down the number of pulses applied to it and thus provide an overall frequency division equal to product of the individual divisions. When blocking oscillators are connected in series, in such a manner, errors arise due to interaction between adjacent stages when they fire. My invention prevents or neutralizes this interaction between stages, by appropriate special coupling means, generally designated C. The manner in which the two species operate is, however, different, and will be described hereinafter.

Referring now to the form of my invention shown in Fig. 1, the means C results in stage B firing after stage A is cut off, so that feedback from stage B cannot affect stage A.

The stages A and B include triode tubes 10 and 44, each of which connects from B+ through one winding (14a+46a) of its associated transformer, to the plate and from the cathode through the other winding (14b+46b) of the same transformers to ground. The transformers are so poled that as the plate of the tube goes negative the cathode of the same tube will also go negative.

Each tube has an RC grid circuit for controlling its bias to control the counting ratio of the stage. The signal is applied at terminal 24 and couples from the first stage through capacitor 38 to the second stage, and is fed out from there at the cathode lead 48. The coupling between blocking oscillator stages is such that the later stage will not fire until the preceding blocking oscillator stage cuts off.

The operation for this purpose is as follows. The grid 12 of the first tube 10 will try to go positive and cause tube 10 to conduct. When the tube starts conducting the current through transformer winding 14a will increase, which will induce a voltage in the winding 14b, which will drive the cathode lead 26 negative. The grid lead 12 effectively becoming more positive causes grid current to flow and the tube 10 conducts even heavier. The grid current removes charge from capacitor 16 to make the grid go negative. This action continues until the grid lead 12 of tube 10 reaches the same or a slightly lower voltage than cathode 26. At this point the grid lead 12 of the tube will be very negative. The grid will now relax toward cut off due to condenser 16 discharging, exponentially, toward the positive voltage determined by the setting of tap 18 on resistance 20 of the voltage divider made up of resistances 20 and 22. Positive pulses coming in at terminal 24 will add a series of spikes to the grid voltage, as shown at 200 in Fig. 2.

After the first two pulses 200 (Fig. 2) occur, the grid 12 will have risen high enough so that the next pulse will bring the grid above cut-off and trigger the tube 10. The waveform 202 shown in Fig. 2 includes a swing 204 going negative, and then as the tube cuts off a swing 206 going positive.

This wave is coupled onto the grid 42 of tube 44 through capacitors 38 and 40. The waveform that appears on grid 42 is shown at 202′ in Fig. 2. The initial or negative portion 204′ of this wave 202′, will prevent tube 44 from firing, and then the positive portion 206′ of the wave 202′ will trigger the tube 44 when the grid 42 is at a high enough potential. The first stage will be cut-off by this positive tail 206′, and at the same time the second stage cannot fire until the positive tail occurs. In this way the first stage will always be off when the latter operates, hence there will be no interference.

Figure 2:
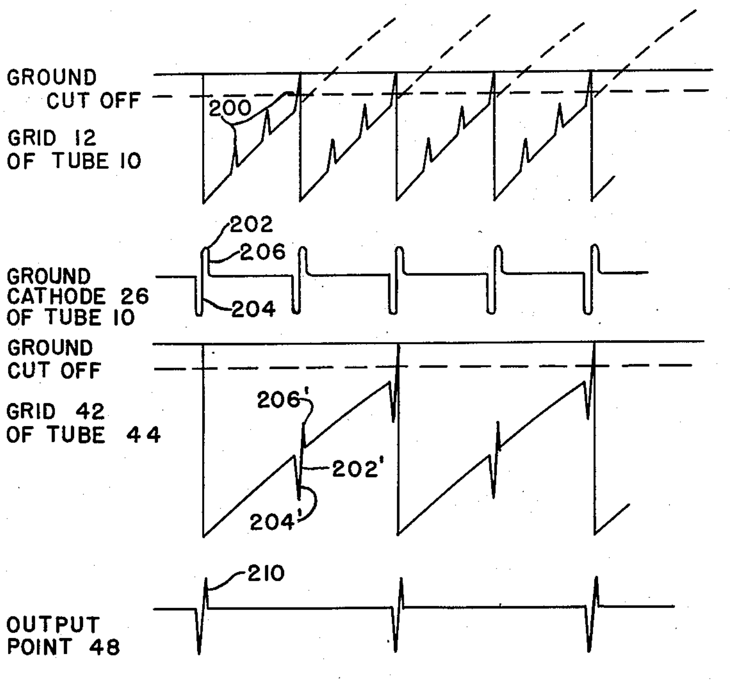
Fig. 2 shows the wave forms and is explanatory of the circuit shown in Fig. 1.

Each time the first stage fires (after a certain number of applied pulses 200, illustrated as 3 in Fig. 2), the signal 202′ described above, will be applied to the grid 42 of tube 44. This grid will operate in a manner similar to grid 12, and with every other pulse, in the particular case illustrated in Fig. 2, it too will fire and put out an even lower pulse rate, as shown at 210 in Fig. 2.

It should be borne in mind that although the first stage is illustrated as dividing 3:1 and the second 2:1 this need not be the dividing ratio in actual use, and instead the said ratios may be varied. Although only two blocking oscillators are shown, any number may be connected together in the manner indicated in Fig. 1.

Another circuit utilizing features of my invention is shown in Fig. 3. In this circuit the method of coupling blocking oscillators A and B is different, and the means C is here designed to neutralize any feed back from stage B to stage A, instead of changing the relative time of firing of the stages. The signal input also differs, since negative pulses are applied to the plate of tube 54, instead of positive pulses being applied to the grid as in tube 10 of Fig. 1.

Each time tube 58 in Fig. 3 fires, a negative pulse is coupled through capacitor 72 to the plate 78 of tube 76. After a predetermined number of pulses to tube 76 it will fire and its plate 78 will drop in potential. This drop will be fed-back through said capacitor 72 and lower the plate potential of tube 58 far more than it is lowered by the signal pips alone. This action would cause the cathode 56 to drop more, which amounts to increasing the bias on the tube. This will cause the tube grid 54 to go more negative, and perhaps change the dividing ratio of the stage. My invention provides a means for neutralizing this interaction between the two stages A and B.

In operation negative pips are applied through capacitor 50 to the plate 52 of the tube 58. These pulses momentarily drop the voltage at plate 52, causing current to flow through winding 60b of the transformer. This induces a voltage in winding 60a of such a polarity that the cathode 56 of tube 58 will momentarily be driven negative.

Tube 58 obtains its grid bias at the adjustable point 67 on the voltage divider made up of resistors 68 and 74. The voltage at point 67 is applied to the grid 54 through a large resistor 66. This bias arrangement will try to make the grid positive, but when the tube 58 conducts, the grid is driven very negative because of electron flow building up a negative charge on capacitor 62. When the tube 58 cuts off its grid 54 discharges exponentially toward point 67 through resistor 66, as shown by curve 98 in Fig. 4.

Figure 4:
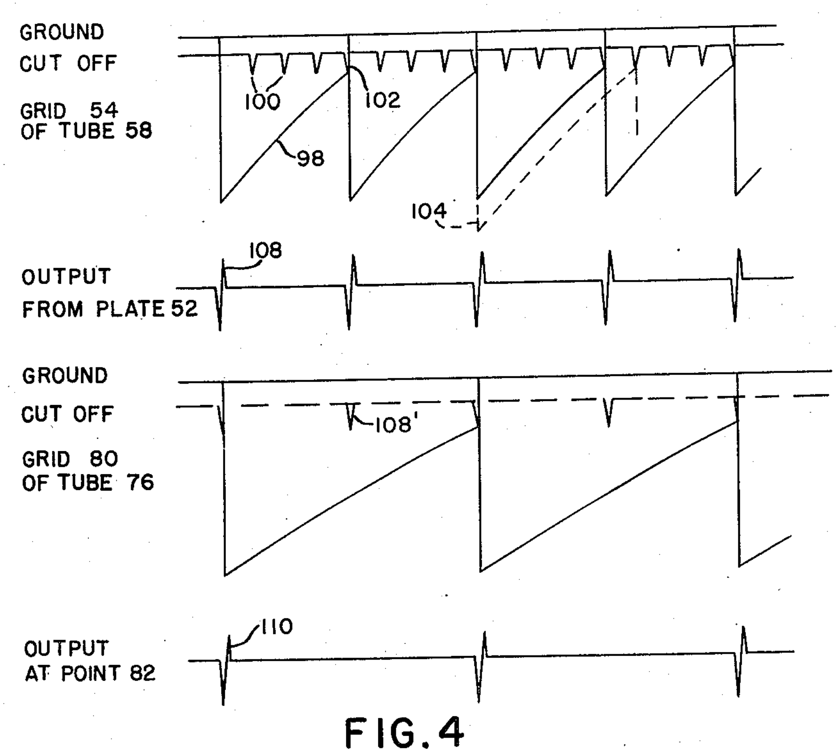
Fig. 4 shows the wave forms and is explanatory of the circuit shown in Fig. 3.

Each time the cathode 56 goes negative as the input pulses are applied to the plate 52, the cut-off point of the tube 58 is effectively lowered as indicated by pulses 100 in Fig. 4. After three pulses 100 the grid will have risen high enough, as shown by curve 98, so that the fourth pulse 100 will cause the tube to conduct, as indicated at point 102.

Referring back to Fig. 3, when tube 58 conducts a pulse is applied through capacitor 72 to the plate 78 of tube 76. Tube 76 operates in a manner similar to tube 58 in the first stage. Pulses applied to the first stage are counted down at a ratio depending on the voltage at tap 67 and the values of resistor 66 and capacitor 62. The resulting pulses 108 (Fig. 4) when applied to the second stage lower the cathode voltage of tube 76 (Fig. 6), as shown at 108′ (Fig. 4). Tube 76 operates like the preceding tube 58. Each time it does fire it does so at the same time as tube 58, and the applied pulses 108 (Fig. 4) are counted down more. The output 110 is then taken out at cathode 82 (Fig. 3) of the tube 76.

When the second tube 76 conducts, its plate 78 will go quite negative. This negative signal is coupled back to the plate 52 of tube 58 through the capacitor 72, and might drive the cathode 56 of tube 58 lower than it is normally driven by the input pulses, which in turn would cause the grid to go lower while the tube 58 is conducting, as is indicated by dotted line 104 in Fig. 4. This may change the counting ratio of the first stage, and affect the accuracy of the whole system.

To neutralize the effect of such a feed back through capacitor 72 I have provided another capacitor 70 tied between the plate 78 of tube 76 and the grid 54 of tube 58. Negative pulses from plate 78 will now be fed back to the grid 54 of tube 58 through capacitors 70 and 62. These pulses will lower the grid voltage of grid 54 to neutralize the effect of the other feed back to the plate 52 of tube 58. This neutralization is performed in such a way that the stages all operate together so there is no appreciable change in the phase of the output signals.

It should be borne in mind that although the circuit is illustrated as dividing at a ratio of 4:1 and 2:1, other ratios may be employed in actual practice. Moreover, although only two blocking oscillator stages are shown, a greater number of series connected frequency dividing blocking oscillators may be used, and may be protected against undesired interaction as above described.

It is believed that the construction and operation, as well as the advantages of my improved frequency divider circuits, will be apparent from the foregoing detailed description thereof. It will also be apparent that while I have shown and described my invention in several preferred forms, changes may be made in the circuits disclosed, without departing from the spirit of the invention, as sought to be defined in the following claims.

What is claimed is:

1. A frequency dividing circuit comprising a plurality of synchronized blocking oscillators in series, each of said oscillators including an electron tube having at least an anode and a frequency control circuit, capacitor coupling means coupling said anode of said electron tube in each of said oscillators to the anode of the electron tube in the following oscillator in said series for synchronizing the oscillation of said following oscillator, and second capacitor coupling means coupling the anode of each of said oscillators in said series to the frequency control circuit of the preceding oscillator in said series to neutralize the effect of the operation of each oscillator on the preceding oscillator in said series.

2. A frequency dividing circuit comprising a plurality of synchronized blocking oscillators in series, each of said blocking oscillators comprising an electron tube having at least an anode, a cathode and a control grid, a transformer having the primary thereof connected between said anode and a source of anode potential and the secondary thereof connected between said cathode and a point of reference potential and a bias circuit coupled to said control grid, said bias circuit being adapted to bias said grid negatively with respect to said cathode upon conduction through said electron tube and to cause the potential of said grid to rise with time in the absence of conduction through said electron tube, means coupling said anode in each of said oscillators to the anode in the following oscillator in said series and means coupling the anode in each of said oscillators to the bias circuit of the preceding oscillator to neutralize the effect of operation of each of said oscillators on the preceding oscillator in said series.

3. A frequency dividing circuit comprising a plurality of synchronized blocking oscillators connected in series, each of said oscillators comprising an electron tube having at least a grid, a cathode and an anode, a transformer, said transformer having a primary winding connected from said anode to a source of anode potential and a secondary winding connected from said cathode to a point of fixed reference potential, a first capacitor having one terminal thereof connected to said grid, a relatively low impedance connecting a second terminal of said first capacitor to said point of reference potential, and a relatively high resistive impedance coupling said grid to a source of positive potential, said series connection comprising capacitive coupling means coupling the said anodes in successive oscillator circuits and additional capacitive coupling means coupling the said anode in each oscillator circuit to the junction of said first capacitor and said low impedance means of the preceding oscillator in said series and means for coupling a periodic series of pulses to the first blocking oscillator in said series.

4. A frequency dividing circuit comprising a plurality of blocking oscillators in series, each of said blocking oscillators comprising an electron tube having at least an anode, a cathode and a control grid, a transformer having the primary thereof connected between said anode and a source of anode potential and a secondary thereof connected between said cathode and a point of reference potential, a first capacitor having one terminal thereof connected to said grid, a relatively low impedance connecting a second terminal of said first capacitor to said point of reference potential, and a relatively high resistive impedance coupling said grid to a source of positive potential, means coupling a pulse output signal from one winding of said transformer of each blocking oscillator in said series to a point in the following oscillator of said series at which said pulse signal will initiate the operation of said following oscillator, and means for coupling a periodic pulse signal to the grid of the first oscillator in said series.

5. A frequency dividing circuit comprising a plurality of synchronized blocking oscillators connected in series, each of said oscillators comprising an electron tube having at least a grid, a cathode and an anode, a transformer, said transformer having a primary winding connected from said anode to a source of anode potential and a secondary winding connected from said cathode to a point of fixed reference potential, a first capacitor having one terminal thereof connected to said grid, a relatively low resistive impedance connecting a second terminal of said first capacitor to said point of reference potential, a voltage divider having an adjustable tap, said voltage divider being coupled between said point of reference potential and a point of positive potential, and a relatively high resistive impedance coupling said grid to said tap on said voltage divider, said series connection comprising capacitive coupling means coupling the said anodes in successive oscillator circuits and additional capacitive coupling means coupling said anode in each oscillator circuit to the junction of said first capacitor and said low impedance means of the preceding oscillator in said series and means for coupling a periodic series of pulses to the first blocking oscillator in said series.

ROGER B. WOODBURY.

References Cited in the file of this patent

UNITED STATES PATENTS

| Number | Name | Date |
|---|---|---|
| 2,093,882 | Dirks | Sept. 21, 1937 |
| 2,113,011 | White | Apr. 5, 1938 |
| 2,390,608 | Miller | Dec. 11, 1945 |
| 2,411,573 | Holst et al. | Nov. 26, 1946 |
| 2,415,567 | Schoenfeld | Feb. 11, 1947 |
| 2,444,890 | Hite et al. | July 6, 1948 |
| 2,493,517 | Applegarth, Jr. | Jan. 3, 1950 |